United States Patent
Knoch et al.

[11] Patent Number: 5,703,389
[45] Date of Patent: Dec. 30, 1997

[54] VERTICAL IGFET CONFIGURATION HAVING LOW ON-RESISTANCE AND METHOD

[75] Inventors: Lynnita K. Knoch, Chandler; Pak Tam, Tempe, both of Ariz.

[73] Assignee: Motorola, Inc., Schaumburg, Ill.

[21] Appl. No.: 393,772

[22] Filed: Feb. 24, 1995

[51] Int. Cl.$^6$ ............ H01L 29/76; H01L 31/062
[52] U.S. Cl. ............ 257/327; 257/266; 257/286; 257/328; 257/342; 437/44; 437/45; 437/51
[58] Field of Search ............ 257/327, 341, 257/328, 266, 286, 342; 437/40, 44, 45, 51

[56] References Cited

U.S. PATENT DOCUMENTS

| | | | |
|---|---|---|---|
| 4,532,534 | 7/1985 | Ford et al. | 257/342 |
| 4,775,879 | 10/1988 | Robb et al. | 357/23.4 |
| 4,833,513 | 5/1989 | Sasaki | 257/342 |
| 5,208,471 | 5/1993 | Mori et al. | 257/327 |
| 5,396,097 | 3/1995 | Robb et al. | 257/341 |
| 5,521,410 | 5/1996 | Yamamoto | 257/342 |

Primary Examiner—Tom Thomas
Assistant Examiner—David Ostrowski
Attorney, Agent, or Firm—Kevin B. Jackson

[57] ABSTRACT

A vertical IGFET configuration includes a stripe arrangement having a non-linear shape. In one example, a stripe arrangement (30) has contact cut-out portions (41) and elongated portions (42). The elongated portions (42) have a width (44) that less than the width (43) of the contact cut-out portions (41). The stripe arrangement (30) increases channel density compared to typical individual cell configurations (10) and straight stripe configurations (20) thereby lowering on-resistance.

17 Claims, 2 Drawing Sheets

VERTICAL IGFET CONFIGURATION HAVING LOW ON-RESISTANCE AND METHOD

BACKGROUND OF THE INVENTION

This invention relates, in general, to vertical field effect transistor devices, and more particularly, to structural arrangements of high density vertical insulated gate field effect transistors to provide improved characteristics.

High density (typically greater than 800,000 cells/cm$^2$) vertical insulated gate field effect transistor (IGFET) devices are emerging as a preferred design choice in power transistor applications such as anti-lock brake systems, electronic power steering, solid state relays, and switching power supplies. High density vertical IGFET devices are preferred because they offer, among other things, lower on-resistance per unit area compared to standard density IGFET devices (typically on the order of 155,000 cells/cm$^2$). High density vertical IGFET devices having low on-resistance provide lower power losses, which benefits, for example, battery powered equipment.

Several high density vertical IGFET configurations have been reported including individual cell designs and straight or linear stripe designs. In a typical straight stripe design, source stripes are placed within base stripe regions and the base stripe regions are tied together to form a common base structure. Typical straight stripe designs have improved breakdown voltage characteristics compared to individual cell designs. However, in typical straight stripe designs, the channel density is less than in individual cell designs. This lower channel density contributes to higher on-resistance in straight stripe designs compared to individual cell designs.

As is readily apparent, what is needed is a configuration for vertical IGFET devices that provides the advantages of a stripe design and that has good on-resistance characteristics.

DETAILED DESCRIPTION OF THE DRAWINGS

Generally, the present invention provides a stripe configuration or arrangement for high density vertical IGFET devices that provides lower on-resistance characteristics compared to typical high density designs. In particular, the stripe configuration according to the present invention includes stripe regions having a non-linear shape that increases channel density thereby providing a vertical IGFET device having a low on-resistance.

In one example, the present invention provides a non-linear stripe arrangement having an elongated portion and a contact cut-out portion wider than the elongated portion. The arrangement increases channel density compared to typical individual cell and straight stripe designs thereby lowering on-resistance. Additionally, the arrangement provides improved breakdown voltage characteristics compared to typical individual cell designs.

Figure 1:
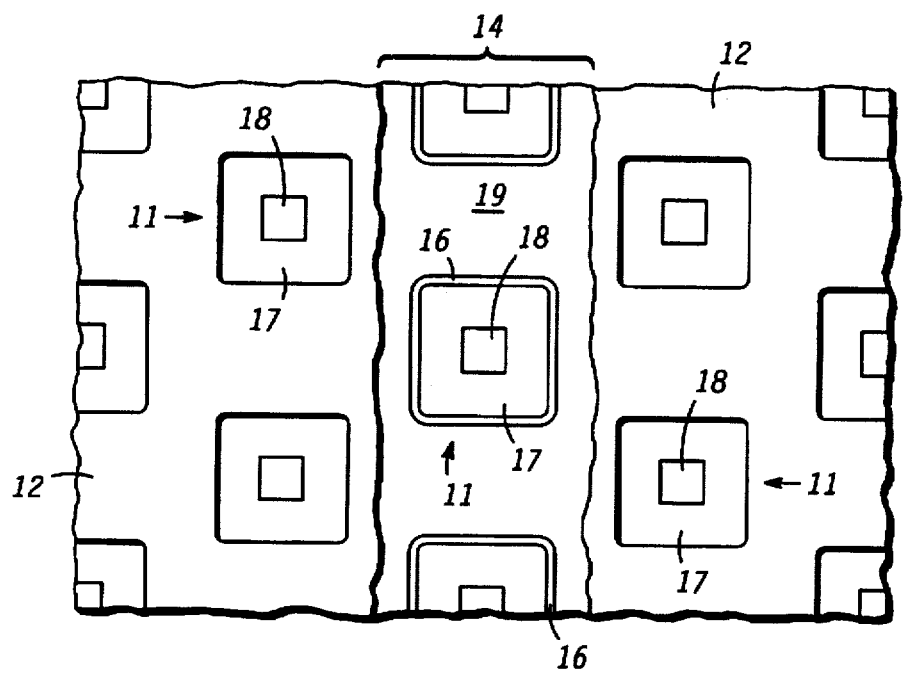
FIG. 1 illustrates an enlarged top view of a portion of a prior art individual cell configuration.

The present invention can be better understood with reference to FIGS. 1–4 together with the following detailed description. FIG. 1 illustrates an enlarged top view of a portion of a prior art individual cell arrangement 10 for a vertical IGFET device. Individual cell arrangement 10 includes individual cells 11 surrounded above by insulated gate region 12. A portion 14 of insulated gate region 12 has been left off to provide a more complete view of the structure beneath insulated gate region 12. The lines shown in portion 14 merely indicate a transition in dopant conductivity types.

As shown in portion 14, individual cells 11 comprise a well or base region 16, a source region 17, and a doped contact region 18. A portion of a common drain region 19 is visible between individual cells 11 in portion 14. The channel for each of individual cells 11 is formed between the edge of source region 17 and the junction of well region 16 and common drain region 19. The channel density of the individual cell configuration of FIG. 1 is on the order of 28 meters/cm$^2$. As is well known in the art, channel density is the amount of horizontal channel length within a given area. Typically, the cell density of the individual cell configuration of FIG. 1 is on an order of 930,000 cells/cm$^2$. The individual cell design has several disadvantages including a lower breakdown voltage compared to straight stripe arrangements.

Figure 2:
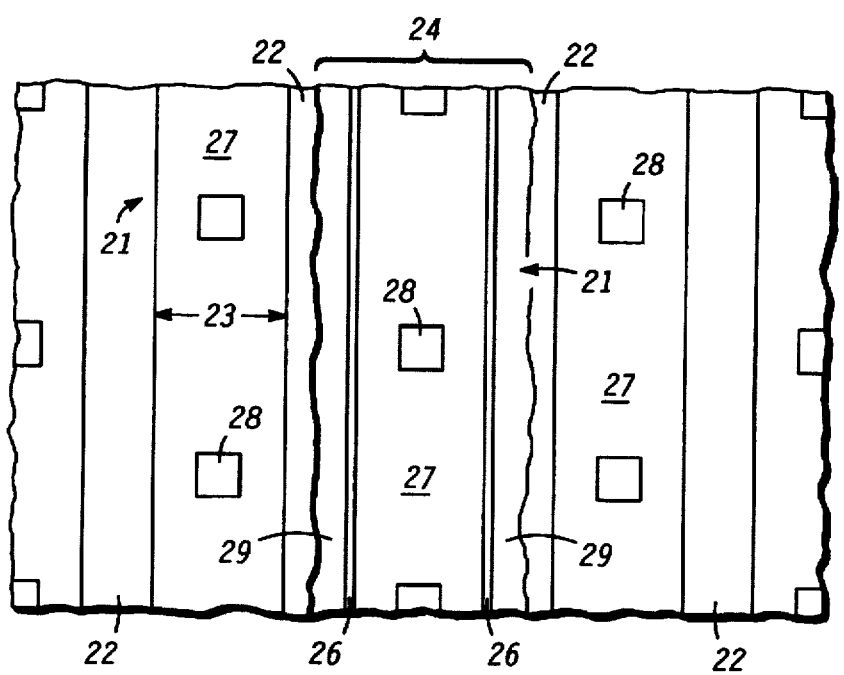
FIG. 2 illustrates an enlarged top view of a portion of a prior art straight stripe configuration.

FIG. 2 illustrates an enlarged top view of a portion of a prior art straight or linear stripe arrangement 20 for a vertical IGFET device. Straight stripe arrangement 20 includes stripe regions or cells 21. As can be seen from FIG. 2, the edges of stripe regions 21 are in a straight line providing a linear shape. An insulated gate region 22 lies between and above a portion of each of stripe regions 21.

A portion 24 of insulated gate region 22 has been left off to provide a more complete view of the structure beneath insulated gate region 22. The lines shown in portion 24 merely show a transition in dopant conductivity types. As shown in portion 24, each of stripe regions 21 comprise a well or base region 26, a source region 27, and doped contact regions 28. A portion of a common drain region 29 is shown outside of well region 26 in portion 24. The channel for each stripe is formed between the edge of source region 27 and the junction of well region 26 and common drain region 29. Typically, source region 27 has a width 23 in a range from 3.0 to 5.0 microns.

Typically, straight stripe arrangement 20 has a cell density on an order of 700,000 cells/cm$^2$ and a breakdown voltage that typically is 10–15% higher than individual cell arrangement 10. This is due in part to the well design of the straight stripe, which reduces the high field effects associated with the sharp corners in the well regions of the individual cell design. However, the channel density of straight stripe arrangement 20 typically is on the order of 20 meters/cm$^2$. This is significantly less than the channel density of individual cell arrangement 10 and, as a result, straight stripe arrangement 20 typically has an on-resistance that is 10–20% higher than individual cell arrangement 10.

Figure 3:
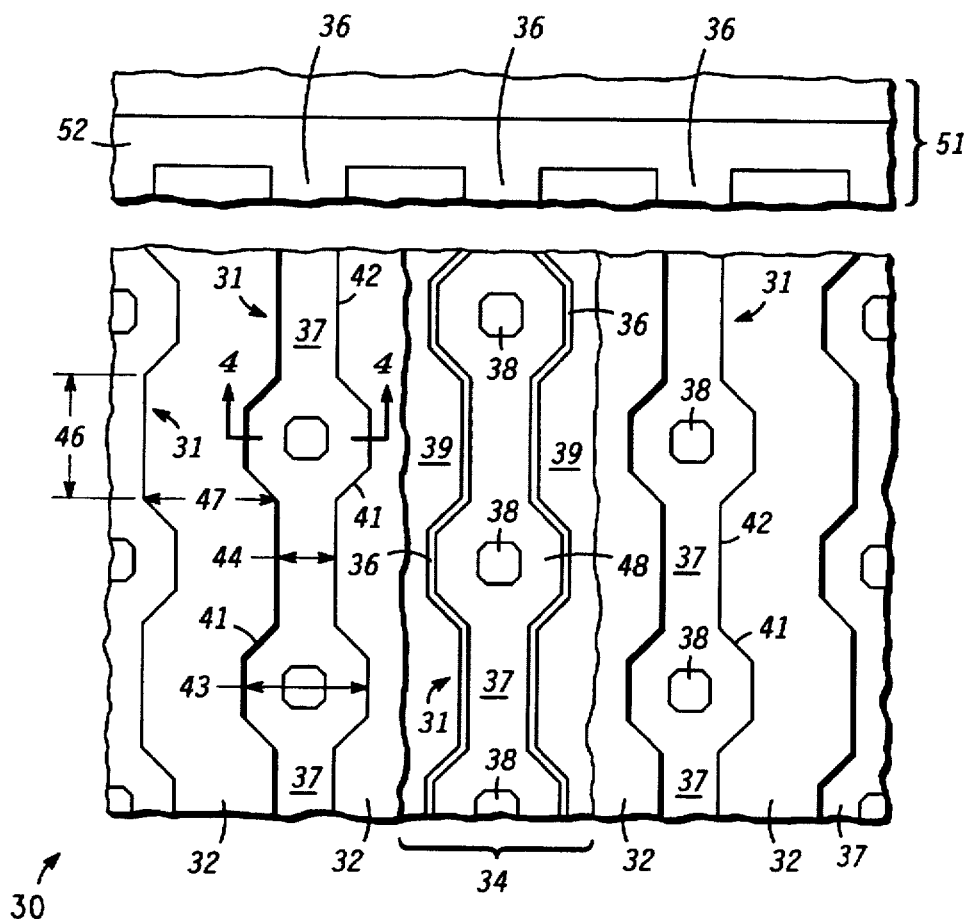
FIG. 3 illustrates an enlarged top view of a stripe configuration according to the present invention.

FIG. 3 illustrates an enlarged top view of a portion of a stripe configuration or arrangement 30 having a non-linear shape for a vertical IGFET device according to the present invention. Stripe configuration 30 comprises stripes or stripe regions 31. As can be seen from FIG. 3, the edges of stripe regions 31 are non-linear (i.e., they are not in a straight line). An insulated gate region or layer 32 lies between and partially above adjacent stripe regions 31 (this is more clearly shown in FIG. 4).

A portion 34 of insulated gate region 32 has been left off to provide a more complete view of the structure beneath insulated gate region 32. The lines shown in portion 34 merely indicate a transition in dopant conductivity type. As shown in portion 34, each of stripe regions 31 includes a source region 37 within a well or base region 36. A portion of a common drain region 39 is shown outside of the well region exposed in portion 34. The channel for each stripe is formed between the edge of source region 37 and the junction of well region 36 and common drain region 39.

Stripe regions 31 have a non-linear shape or pattern that includes contact cut-out portions 41 and elongated portions 42. As can be seen from FIG. 3, one of elongated portions 42 between two of contact cut-out portions 41 resembles a "dumb-bell" or "dog-bone" shape. Contact cut-out portions 41 have a width 43 at a widest point. Elongated portions 42 have a width 44 that is less than width 43. In other words, width 43 is the widest distance between adjacent portions of insulated gate region 32 that partially surround contact cut-out portions 41. Width 44 is the widest distance between adjacent portions of insulated gate region 32 that border two sides of elongated portions 42. Width 44 also is the width of source region 37 in elongated portions 42.

To form stripe regions 31, the "dumb-bell" shape preferably is formed in insulated gate region 32 after insulated gate region 32 has been deposited onto an underlying semiconductor material. After the "dumb-bell" shape is formed, well region 36 is formed first, followed by source region 37. Both regions are formed by incorporating the appropriate dopants (n-type or p-type) into the underlying semiconductor material through the "dumb-bell" shape formed in insulated gate region 32.

Contact cut-out portions 41 are shown with an octagon shape. Optionally, contact cut-out portions 41 have other shapes including a circular or a rounded shape or other multi-sided shapes. Although elongated portions 42 are shown as straight segments, other non-straight variations for elongated portions 42 are possible including zig-zag shapes. In addition, width 44 may vary along the length of elongated portions 42.

Typically, width 44 is in a range from approximately 1.0 to 3.5 microns and width 43 is approximately 0.5 to 2.0 microns greater than width 44. Typically, elongated portions 42 have a height 46 less than 20.0 microns with a range from 5.0 to 10.0 microns preferred. Typically, elongated portions 42 in adjacent stripe regions 31 are spaced apart a distance 47 in a range from approximately 3.0 to 7.0 microns with 4.0 to 5.0 microns preferred. With these dimensions, insulated gate region 32 can be wider than width 44 of source region 37 in elongated portions 42.

Stripe regions 31 further include doped contact regions 38 located within each of contact cut-out portions 41. Preferably, doped contact regions 38 have a shape or geometry that maximizes contact area to that portion 48 of source region 37 that is within or bounded by contact cut-out portions 41. For example, doped contact regions 38 have a circular, diamond, or multi-sided shape. Optionally, doped contact regions 38 have the same shape as as contact cut-out portions 41.

By using the "dumb-bell" shape, channel density is increased because the source width at width 44 is reduced to smaller dimensions compared to source width 23 in straight stripe arrangement 20. This shape increases the horizontal channel length. Width 44 ultimately is limited by photolithographic process capability. The dimensions provided above are easily achieved in manufacturing using commercially available photolithographic equipment (e.g. stepper equipment) having at least a 1.5 micron capability and well known positive photoresist processing.

Preferably and as shown in FIG. 3, adjacent stripe regions 31 are shifted or off-set such that contact cut-out portions 41 of one stripe region are next to elongated portions 42 of an adjacent stripe region. By arranging adjacent stripe regions in this manner, distance 47 is minimized so that channel density is further increased because stripe regions 31 can be placed closer together. With this shifted "dumb-bell" arrangement, a channel density on the order of 31 to 46 meters/cm$^2$ is achieved. This significant increase in channel density results in an on-resistance that is 25% lower than individual cell arrangement 10 and 35% lower than straight stripe arrangement 20. With stripe arrangement 30, a vertical IGFET device having a cell density on an order of 1.4 million cells/cm$^2$ is achieved, which is a 50% increase in cell density compared to individual cell arrangement 10 and about a 90–100% increase in cell density compared to straight stripe arrangement 20.

Portion 51 is provided to show a common or single base configuration, which is typical in stripe arrangements. Portion 51 is shown with insulated gate region 32 removed. For example, each well region 36 is tied or connected together using a common doped region 52 to form such a configuration. Typically, each well region 36 is tied together around a periphery of the vertical IGFET device.

Figure 4:
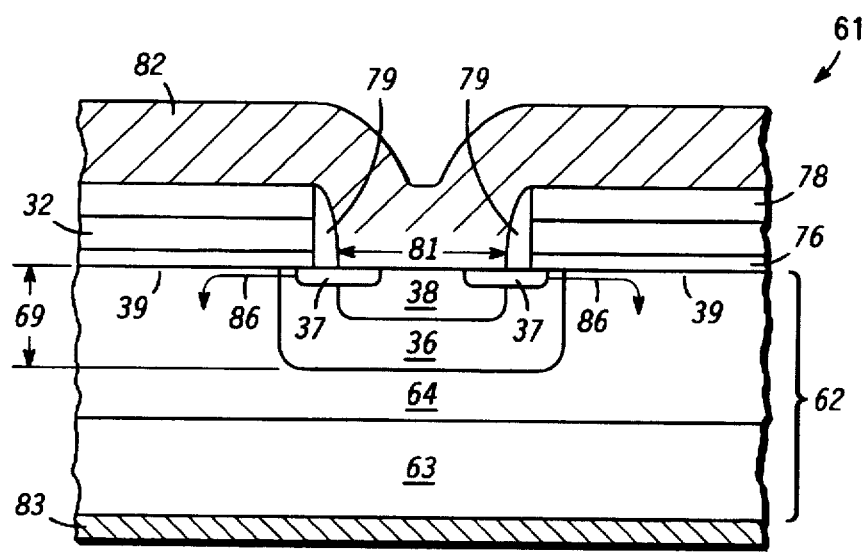
FIG. 4 illustrates an enlarged cross-sectional view of a portion of a vertical IGFET taken along reference line 4 of FIG. 3 with additional layers.

FIG. 4 illustrates an enlarged cross-sectional view of a portion of a vertical IGFET device 61 according to the configuration of FIG. 3 after additional layers have been formed. The portion shown in FIG. 4 is taken along reference line 4 of FIG. 3. The same reference numbers from FIG. 3 are used in FIG. 4 where appropriate to show the equivalent regions.

Vertical IGFET device 61 includes a semiconductor substrate or substrate 62 having a first surface and second or opposite surface parallel to the first surface and is configured to conduct current from the first surface to the second surface. Substrate 62 typically includes a starting substrate 63 having a high dopant concentration and a doped layer 64 formed on starting substrate 63. Doped layer 64 is of the same conductivity type as starting substrate 63, but is more lightly doped. For example, in an n-channel device, starting substrate 63 and doped layer 64 have an n-type conductivity. In a p-channel device, starting substrate 63 and doped layer 64 have a p-type conductivity. Doped layer 64 has a dopant concentration that depends on the desired breakdown voltage characteristics of the finished device. Typically, doped layer 64 has a thickness in a range from approximately 1.5 to 6.0 microns. Doped layer 64 is formed using well known techniques. That portion of doped layer 64 around and below well region 36 is common drain region 39.

Base or well region 36 is formed on a surface of substrate 62 and extends to a depth 69 into substrate 62. Well region 36 is doped with a dopant having an opposite conductivity type than doped layer 64. For example, in an n-channel device, well region 36 has a p-type conductivity. In a p-channel device, well region 36 has an n-type conductivity. Well region 36 typically is referred to as the "high voltage" region because of its breakdown voltage characteristics. In a typical device, well region 36 has a surface dopant concentration in range from approximately $5.0 \times 10^{16}$ to $5.0 \times 10^{17}$ atoms/cm$^3$. Depth 69 typically is in a range from approximately 0.7 to 1.5 microns.

Source region 37 is formed within well region 36 and extends to a depth less than depth 69. Source region 37 typically has a depth in a range from 0.15 to 0.25 microns. In FIG. 4, source region 37 is illustrated as being two portions within well region 36 because the cross-section, as illustrated in FIG. 3, is taken right through the center of one of contact cut-out portions 41 (which includes one of doped contact regions 38). Source region 37 is doped with a dopant having the same conductivity type as doped layer 64 and starting substrate 63. Typically, source region 37 has a surface dopant concentration in a range from approximately $1.0 \times 10^{19}$ to $1.0 \times 10^{20}$ atoms/cm$^3$.

Doped contact regions 38 are formed between a portion of source region 37 (within contact cut-out portions 41) and extend into well region 36 to a depth on an order of 0.4 to 0.7 microns. As is well known in art, doped contact regions 38 provide a buried channel contact. Doped contact regions 38 are doped with a dopant having the same conductivity type as well region 36, but are doped to a higher dopant concentration than well region 36. Typically, doped contact regions 38 have a surface dopant concentration in a range from approximately $1.0 \times 10^{18}$ to $1.0 \times 10^{19}$ atoms/cm$^3$.

Gate dielectric layer 76 is formed over a portion of source region 37, a portion of well region 36, and doped layer 64 (which includes common drain region 39). Gate dielectric layer 76 typically comprises a silicon oxide, has a thickness on an order of 250 to 1500 angstroms, and is formed using well known techniques. Insulated gate region 32 is formed over gate dielectric layer 76 and typically comprises a doped polycrystalline semiconductor material such as polysilicon. Insulated gate region 32 is formed using well known processing techniques. Passivation layer 78 is formed over insulated gate region 32 and typically comprises a dielectric such as silicon oxide. Optionally, passivation layer 78 comprises a multilayer passivation such as a silicon nitride layer formed on insulated gate region 32 and a silicon oxide layer formed on the silicon nitride layer. Passivation layer 78 is formed using well known processing techniques.

In a preferred embodiment, gate dielectric layer 76, insulated gate region 32, and passivation layer 78 are formed on substrate 62. The non-linear stripe configuration (e.g. the "dumb-bell" configuration) is patterned at least into passivation layer 78 and insulated gate region 32. Well region 36 is then formed in doped layer 64 followed by source region 37 and doped contact regions 38. Well region 36, source region 37, and doped contact regions 38 are formed using, for example, ion implantation techniques.

Source ohmic layer or source electrode 82 is formed over passivation layer 78 and contacts source region 37 and doped contact regions 38. Spacer regions 79 isolate source ohmic layer 82 from insulated gate region 32. Spacer regions 79 typically comprise a silicon oxide and are formed using well known techniques. For example, spacer regions 79 are formed by depositing a silicon oxide layer followed by a masked etching process to provide the structure in FIG. 4. Optionally, an unmasked etching process is used to form spacer regions 79. Such a process is commonly referred to as a self-alignment process. Distance 81 between opposite spacer regions 79 is on an order of 1.5 microns within contact cut-out portions 41. Within elongated portions 42 (not shown in FIG. 4), distance 81 is on an order of 0.7 microns.

Source ohmic layer 82 typically comprises aluminum or an aluminum alloy. A gate ohmic layer (not shown) is formed on the same surface of as source ohmic layer 82 and contacts insulated gate region 32. The gate ohmic layer typically comprises the same material as source ohmic layer 82. Common drain ohmic layer or drain electrode 83 is formed over the second surface of substrate 62 and typically comprises a multilevel metallization such as titanium/nickel/silver or the like. Source ohmic layer 82, the gate ohmic layer, and common drain ohmic layer 83 are formed using well known processing techniques.

Arrows 86 show more clearly how current flows from source region 37 into common drain region 39 then vertically to drain electrode 83. The channel for vertical IGFET device 61 is formed between source region 37 and the junction of well region 36 with common drain region 39. It is understood that the cross-sectional configuration of well region 36 can be modified to further enhance breakdown voltage characteristics of vertical IGFET device 61.

By now it should be appreciated that there has been provided a vertical IGFET device having a non-linear stripe configuration that increases the channel density thereby lowering the on-resistance. The configuration provides an on-resistance that is on the order of 25% lower than typical individual cell designs and 35% lower than typical straight or linear stripe designs. In addition, the configuration provides improved breakdown voltage characteristics compared to typical individual cell designs.

While we have shown and described specific illustrative embodiments of the present invention, further modifications and improvements will occur to those skilled in the art. We desire it to be understood, therefore, that this invention is not limited to the particular forms shown and we intend the appended claims to cover all modifications that do not depart from the spirit and scope of this invention.

We claim:

1. A vertical IGFET configuration having low on-resistance comprising a plurality of stripes formed on one surface of a semiconductor substrate and a drain electrode formed on an opposite surface of the semiconductor substrate, the plurality of stripes extending into the semiconductor substrate and having a non-linear shape that increases channel density thereby providing the low on-resistance, wherein each of the plurality of stripes includes a source region within a base region, and wherein the plurality of stripes is coupled together to form a single base configuration.

2. The configuration of claim 1 wherein the non-linear shape comprises contact cut-out portions having a first width and elongated portions having a second width less than the first width.

3. An IGFET device having a plurality of stripe regions on one surface of a semiconductor substrate and a drain electrode on an opposite surface of the semiconductor substrate, comprising a configuration of the plurality of stripe regions to increase channel density, wherein each of the plurality of stripe regions has a pattern including elongated portions and contact cut-out portions, the contact cut-out portions wider than the elongated portions thereby increasing channel density, and wherein the plurality of stripe regions includes a plurality of source regions within a plurality of base regions, and wherein the plurality of base regions is coupled together to form a single base configuration.

4. The IGFET device of claim 3 wherein adjacent stripe regions are shifted such that the contact cut-out portions of one of the plurality of stripe regions are next to the elongated portions of an adjacent one of the plurality of stripe regions so that adjacent stripe regions are placed closer together thereby further increasing the channel density.

5. The IGFET device of claim 3 further comprising a plurality of doped contact regions, one within each of the contact cut-out portions, wherein the plurality of doped contact regions and the contact cut-out portions have a same shape.

6. A vertical IGFET arrangement having low on-resistance comprising:

a semiconductor substrate having a first surface and a second surface opposite the first surface;

a plurality of well regions formed in the semiconductor substrate and extending from the first surface, each of the plurality of well regions having a non-linear stripe shape including a first portion having a first width and a second portion having a second width less than the first width and wherein each of the plurality of well regions is tied together to form a common base configuration;

a source region formed within each of the plurality of well regions;

a common drain electrode in contact with the second surface; and an insulated gate region formed between adjacent well regions.

7. The arrangement of claim 6 wherein adjacent well regions are offset such that the first portion of one of the plurality of well regions is next to a second portion of an adjacent one of the plurality of well regions.

8. The arrangement of claim 7 wherein a second portion of one of the plurality of well regions is spaced a distance in a range from 3.0 to 7.0 microns from a second portion of an adjacent one of the plurality of well regions.

9. The arrangement of claim 8 wherein the distance is in a range from 4.0 to 5.0 microns.

10. The arrangement of claim 6 wherein the second width is in a range from 1.0 to 3.5 microns.

11. The arrangement of claim 10 wherein the first width is approximately 0.5 to 2.0 microns greater than the second width.

12. The arrangement of claim 6 wherein the second portion has a height less than 20 microns.

13. A method for forming a vertical IGFET device having low on-resistance comprising the steps of:

providing a semiconductor substrate having a first surface and a second surface opposite the first surface;

forming a plurality of well regions in the semiconductor substrate extending from the first surface, each of the plurality of well regions having non-linear stripe shape, and wherein each of plurality of well regions is tied together to form a common base configuration;

forming a source region within each of the plurality of well regions;

forming an insulated gate region on the first surface;

forming a source electrode in contact with the source region within each of the plurality of well regions; and forming a common drain electrode in contact with the second surface.

14. The method of claim 13 wherein the step of forming the plurality of well regions includes forming the plurality of well regions wherein each of the plurality of well regions has a stripe shape including a first portion having a first width and a second portion having a second width less than the first width.

15. The method of claim 14 wherein the step of forming the plurality of well regions includes forming a plurality of well regions wherein adjacent well regions are shifted such that the first portion of one of the plurality of well regions is next to the second portion of an adjacent one of the plurality of well regions.

16. The method of claim 14 wherein the step of forming the plurality of well regions includes forming a plurality of well regions wherein the second width is in a range from 1.0 to 3.5 microns, and wherein the first width is approximately 0.5 to 2.0 microns greater than the second width.

17. The method of claim 14 further comprising the step of forming a plurality of doped contact regions, one doped contact region within a first portion, wherein each of the plurality of doped contact regions and the first portion have a same shape.

* * * * *